(12) United States Patent
Daubenspeck et al.

(10) Patent No.: US 8,680,675 B2
(45) Date of Patent: Mar. 25, 2014

(54) STRUCTURES AND METHODS FOR IMPROVING SOLDER BUMP CONNECTIONS IN SEMICONDUCTOR DEVICES

(75) Inventors: Timothy H. Daubenspeck, Colchester, VT (US); Jeffrey P. Gambino, Westford, VT (US); Christopher D. Muzzy, Burlington, VT (US); Wolfgang Sauter, Richmond, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 12/908,554

(22) Filed: Oct. 20, 2010

(65) Prior Publication Data

US 2011/0031616 A1     Feb. 10, 2011

Related U.S. Application Data

(62) Division of application No. 12/344,802, filed on Dec. 29, 2008, now Pat. No. 7,871,919.

(51) Int. Cl.
*H01L 21/00* (2006.01)

(52) U.S. Cl.
USPC .......................................... 257/737; 257/738

(58) Field of Classification Search
USPC ................................................ 257/737–739
See application file for complete search history.

(56) References Cited

U.S. PATENT DOCUMENTS

| 4,999,318 | A | * | 3/1991 | Takahumi et al. | ............ | 438/309 |
| 5,290,588 | A | * | 3/1994 | Romero et al. | ............... | 427/123 |
| 6,426,557 | B1 | | 7/2002 | Daubenspeck et al. | | |
| 6,503,821 | B2 | | 1/2003 | Farquhar et al. | | |
| 6,717,243 | B2 | | 4/2004 | Shinogi et al. | | |
| 7,033,923 | B2 | | 4/2006 | Seshan | | |
| 7,034,402 | B1 | | 4/2006 | Seshan | | |
| 7,049,171 | B2 | | 5/2006 | Brauer | | |
| 7,256,503 | B2 | | 8/2007 | Daubenspeck et al. | | |
| 7,952,206 | B2 | | 5/2011 | Bachman et al. | | |
| 2004/0048468 | A1 | * | 3/2004 | Liu et al. | ...................... | 438/687 |
| 2005/0093113 | A1 | | 5/2005 | Lin et al. | | |
| 2006/0125118 | A1 | | 6/2006 | Ymazaki | | |
| 2006/0131748 | A1 | | 6/2006 | Seshan | | |
| 2006/0244156 | A1 | | 11/2006 | Cheng et al. | | |
| 2008/0079461 | A1 | | 4/2008 | Lin et al. | | |

FOREIGN PATENT DOCUMENTS

| JP | 2001-053074 | 2/2001 |
| JP | 2001-257226 | 9/2001 |
| JP | 2003-017522 | 1/2003 |
| JP | 2004-047510 | 2/2004 |
| JP | 2007-096315 | 4/2007 |
| WO | WO 2007/127816 | 11/2007 |
| WO | 2008/047585 | 4/2008 |

OTHER PUBLICATIONS

International Search Report and Written Opinion for corresponding International Application No. PCT/EP2009/064260.

* cited by examiner

*Primary Examiner* — Richard Booth
(74) *Attorney, Agent, or Firm* — Richard Kotulak; Roberts Mlotkowski Safran & Cole, P.C.

(57) ABSTRACT

Structures with improved solder bump connections and methods of fabricating such structures are provided herein. The method includes forming a plurality of trenches in a dielectric layer extending to an underlying metal layer. The method further includes depositing metal in the plurality of trenches to form discrete metal line islands in contact with the underlying metal layer. The method also includes forming a solder bump in electrical connection to the plurality of metal line islands.

21 Claims, 5 Drawing Sheets

STRUCTURES AND METHODS FOR IMPROVING SOLDER BUMP CONNECTIONS IN SEMICONDUCTOR DEVICES

CROSS REFERENCE TO RELATED APPLICATIONS

The present application is a divisional application of co-pending U.S. application Ser. No. 12/344,802, filed on Dec. 29, 2008, the contents of which are incorporated by reference in its entirety herein.

FIELD OF THE INVENTION

The invention relates to integrated circuits, and more particularly, to structures with improved solder bump connections and methods of fabricating such structures.

BACKGROUND

Traditionally, high temperature C4 (Controlled Collapse Chip Connection) bumps have been used to bond a chip to a substrate with the most common and widely utilized package being an organic laminate. Conventionally, the C4 bumps (solder bumps) are made from leaded solder, as it has superior properties. For example, lead is known to mitigate thermal coefficient (TCE) mismatch between the chip and the substrate (i.e., organic laminate). Accordingly, stresses imposed during the cooling cycle are mitigated by the C4 bumps, thus preventing delaminations or other damage from occurring to the chip or the substrate.

Lead-free requirements are now being imposed by many countries forcing manufacturers to implement new ways to produce chip to substrate joints. For example, solder interconnects consisting of tin/copper, tin/silver (with high concentrations of silver) and tin/gold in combination with SAC alloys are being used as a replacement for the leaded solder interconnects. With lead-free requirements, though, concerns about defects in C4 interconnections have surfaced, e.g., cracks in chip metallurgy under C4 bumps (named "white bumps" due to their appearance in CSAM inspection processes) which lead to failure of the device. More specifically, white bumps are C4's that do not make good electrical contact to the Cu last metal pad, resulting in either failing chips at functional test or in the field. This may be attributable, at least in part, due to chip designs using high stress Pb-free C4 (solder bumps) which exacerbate C4/AlCu bump to Cu wire adhesion problems.

As one illustrative example, during the chip joining reflow, the chip and its substrate are heated to an elevated temperature (about 250° C.) in order to form the solder interconnection joints. The initial portion of the cool down leads to little stress build up; however, as the joints solidify (around 180° C. for small lead-free joints), increased stress is observed on the package. In particular, as the package (laminate, solder and chip) begins to cool, the solder begins to solidify (e.g., at about 180° C.) and the laminate begins to shrink as the chip remains substantially the same size. The difference in thermal expansion between the chip and the substrate is accommodated by out-of-plane deformation of the device and the substrate, and by the shear deformation of the solder joints. The peak stresses on the device occur during the cool down portion of the reflow.

As the solder is robust and exceeds the strength of the chip, tensile stresses begin to delaminate structures on the chip. The high shear stresses caused by the TCE mismatch between the chip (3.5 ppm) and the laminate (16 ppm) results in an interfacial failure (i.e., a separation between the BEOL copper and the dielectric (e.g., FSG) under the C4). This interfacial failure embodies itself as cracks in the chip metallurgy under C4 bumps. Additionally, there is also a tendency for Sn to diffuse down from the Pb-free solder bump through the BLM/capture pad structure and into the last-metal copper layer, due to inadequate barrier integrity in these overlying films. When this happens, the copper in the last metal level undergoes volume expansion in reaction with the Sn, and creates a crack.

Accordingly, there exists a need in the art to overcome the deficiencies and limitations described hereinabove.

SUMMARY

In a first aspect of the invention, a method of manufacturing a semiconductor structure comprises forming a plurality of trenches in a dielectric layer extending to an underlying metal layer. The method further comprises depositing metal in the plurality of trenches to form discrete metal line islands in contact with the underlying metal layer. The method also comprises forming a solder bump in electrical connection to the plurality of metal line islands.

In a second aspect of the invention, a method of manufacturing a package comprises: forming a plurality of discrete trenches in a dielectric layer extending to an underlying metal layer; depositing a metal liner in the plurality of discrete trenches; depositing a metal material over the metal liner to form discrete metal line islands in contact with the underlying metal layer; depositing a lead free solder bump in electrical connection to the plurality of discrete metal line islands; and bonding a laminate structure to the lead free solder bump.

In a third aspect of the invention, a solder bump structure comprises a dielectric layer having a plurality of discrete trenches filled with a conductive material in contact with an underlying metal layer in the dielectric layer. A metal layer is formed in electrical contact with the plurality of discrete trenches filled with the conductive material. A solder bump is in electrical connection with the metal layer.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits and, more particularly, to structures with improved solder bump connections and methods of fabricating such structures. More specifically, the present invention provides structures and methods of manufacturing such structures which stops fatigue cracks or delamination from occurring in underlying BEOL (back end of line) vias and related metal interconnects and/or pads and/or wires. For example, in implementation, the present invention prevents C4 stresses from being translated to an entire wiring level where it can result in a catastrophic wiring failure. Also, the segmentation of the last-metal copper into islands per will limit any catastrophic propagation of that crack, in the event the copper in the last metal level undergoes volume expansion in reaction with the Sn, and creates a crack. This can be accomplished by providing discrete metal islands or segments of a wiring layer, which prevent stresses imposed during a cooling period from delaminating an entire wiring layer, rending the device inoperable.

The present invention is applicable to all C4 processes, including plating, screening, and physical placement methods such as, for example, C4NP (Controlled Collapse Chip Connection New Process). C4NP, pioneered by International Business Machines Corp., provides flip chip technology combining the advantages of 100 percent lead-free, high reliability, fine pitch, lower material cost, as well as the flexibility to use virtually all types of solder compositions. The processes and structures herein can be used for known and upcoming generations, and is especially applicable to 300 mm wafer technology using C4NP. Accordingly, the processes of the present invention will provide benefits for future copper wiring generations.

Figure 1:
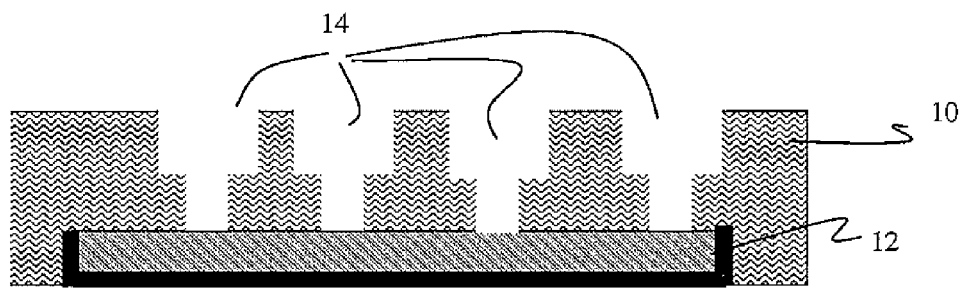
FIGS. 1-8 show structures and respective processing steps in accordance with an aspect of the invention.

In particular, FIG. 1 shows a beginning structure comprising a lower metal layer 12 formed in a dielectric material 10. The lower metal layer 12 may be, for example, a copper material lined with a diffusion barrier layer of tantalum nitride, for example. Those of skill in the art will recognize that the metal layer 12 is not limited to copper lined with tantalum nitride, but may be, for example, any conductive metal lined titanium nitride or other diffusion barrier layers. The dielectric material 10 may be, for example, $SiO_2$.

A plurality of trenches 14 is formed in the dielectric material 10, extending to the underlying metal layer 12, e.g., wire. The trenches 14 form isolated, discrete segments, which are designed to prevent cracks from affecting an entire metal layer (which would otherwise result in device failure). The trenches 14 can be formed using any conventional lithographic and etching processes. For example, the formation of the trenches 14 can be processed using conventional photolithography using a masking layer exposed to light to form openings, and a subsequent etching (e.g., reactive ion etching (RIE)) technique to form the trenches 14 in the dielectric material 10. This may be a two step etching process in that the trenches include two different cross sectional shapes. As these are conventional processes, further explanation is not required for a person of ordinary skill in the art to practice the invention.

The trenches 14 can range from 1 micron to 10 microns across and can be several different shapes and sizes (e.g., smaller and larger openings). The trenches 14 can include radial or arc-shaped offset segments surrounding several sized openings. In embodiments, the trenches 14 can include patterns of one or more openings or shapes such as a grid pattern, checkerboard pattern, segmented lines, overlapping lines, offset lines, perpendicular lines, arc segments or any combination discussed herein.

Figure 2:
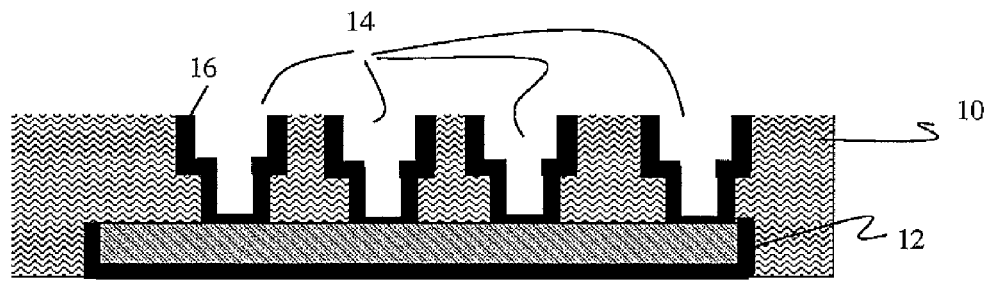

FIG. 2 shows a metal liner 16, e.g., diffusion barrier layer, deposited in the trenches 14. The metal liner 16 may be, for example, a tantalum nitride material. The metal liner 16 is deposited using a conventional deposition method such as, for example, physical vapor deposition (PVD); although other deposition techniques can also be used with the present invention, e.g., chemical vapor deposition (CVD). A chemical mechanical polishing (CMP) can be performed to planarize the surface of the structure of FIG. 2.

Figure 3:
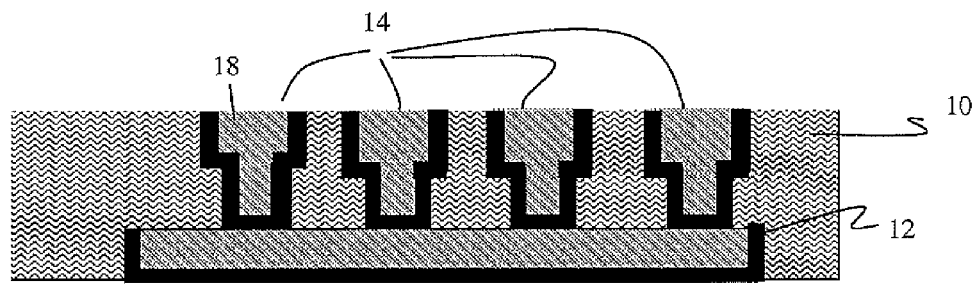

In FIG. 3, a metal material 18 is deposited in the trenches 14. The metal material 18 may be used to form an upper wiring level. More specifically, the metal material 18 may be BEOL wiring structures formed in trenches of the dielectric layer 10. The copper wirings 18 are formed as islands (due to the arrangement of the trenches) such that stresses imposed on the structure will only delaminate an outer island, and will not affect the entire metal layer. This will prevent device failure from occurring when stresses are imposed on the structure. A chemical mechanical polishing (CMP) can also be performed to planarize the surface of the structure of FIG. 3.

Figure 4:
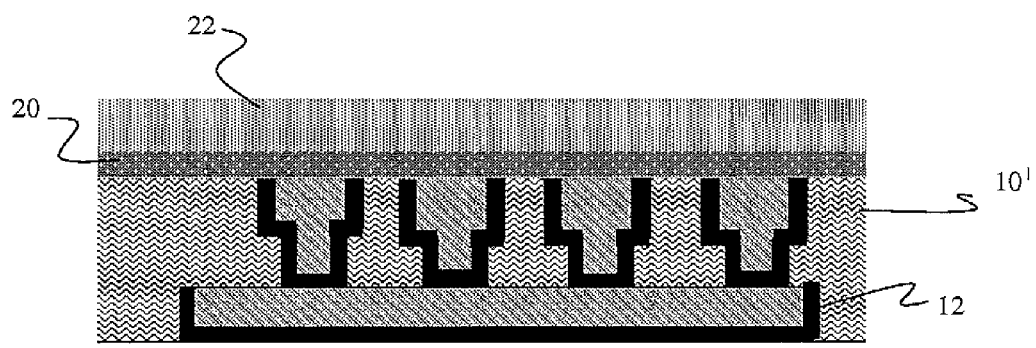

In FIG. 4, dielectric layers 20, 22 are deposited on the planarized surface of the structure of FIG. 3. The dielectric layer 20 may be, for example, SiN. Alternatively, the dielectric layer 20 may be a layered structure of SiN, $SiO_2$ and SiN. The dielectric layer 22 may be a photosensitive polyimide or other type of insulative material deposited on the dielectric layer 20. The dielectric layers 20, 22 can be deposited using a conventional deposition technique such as, for example, CVD. In embodiments, the dielectric layers 20, 22 can range in thickness from about 5 to 10 microns in height; although other dimensions are also contemplated by the invention. In the case of photosensitive polyimide, the dielectric layer 22 can be about 5 microns in thickness.

Figure 5:
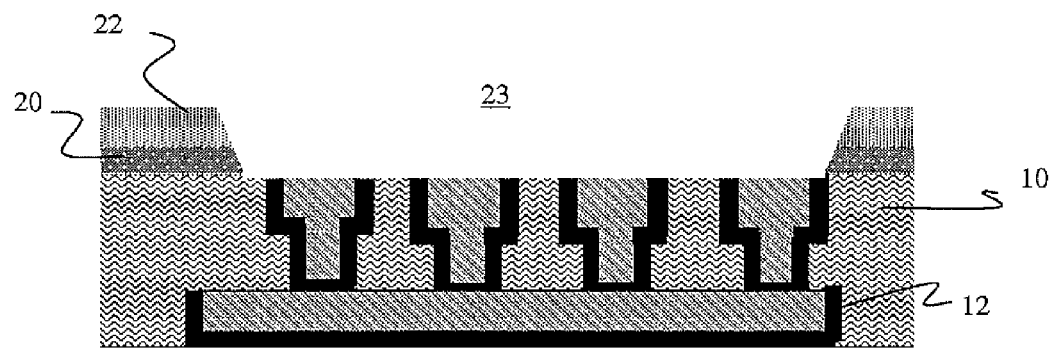

Referring to FIG. 5, the dielectric layers 20, 22 are subject to a patterning step in order to form a via 23. In embodiments, in the case of a photosensitive polyimide, the photosensitive polyimide can be exposed and developed, without the need for a conventional etching process (e.g., RIE). In embodiments using other insulative materials, a conventional lithography and etching process can be used to from the via 23.

Figure 6:
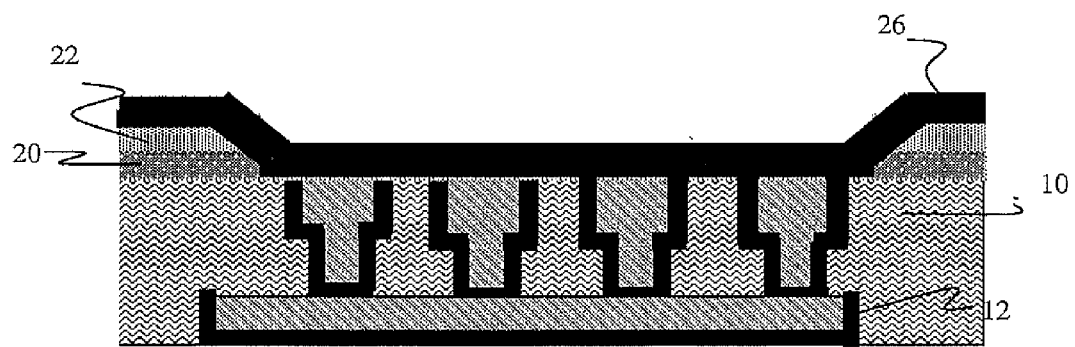

Referring to FIG. 6, a ball limiting metallurgy (BLM) 26 is deposited in the via 23 and over portions of the layer 22. The BLM 26 makes contact with the underlying islands 18. The BLM 26 can be a UBM/BLM pad or capture pad structure 26. The ball limiting metallurgy (BLM) or under bump metallurgy (UBM) can be, for example, made of several layers such as, for example, a nickel material sandwiched between an upper gold layer and a bottom barrier layer. The barrier layer may be a TiW barrier layer with a thickness of typically about 1000 Å to 2000 Å; although other dimensions are contemplated by the invention. The gold layer may be typically about 500-1000 Å; although other dimensions are also contemplated by the invention. The nickel layer may be typically about few microns in thickness; although other dimensions are also contemplated by the invention. In other embodiments, the capture pad 26 may be CrCu/Cu. A capture pad area may range from about 1 micron to 500 microns, with a preferred spacing (width) of about 50 microns. The UBM/BLM pad or capture pad structure 26 can also be comprised of other materials such as, for example, a refractory metal base layer (e.g., TiW), a conductive metal interlayer (e.g. Cu or CrCu), and a diffusion barrier top-layer (e.g., Ni), for example.

Figure 7:
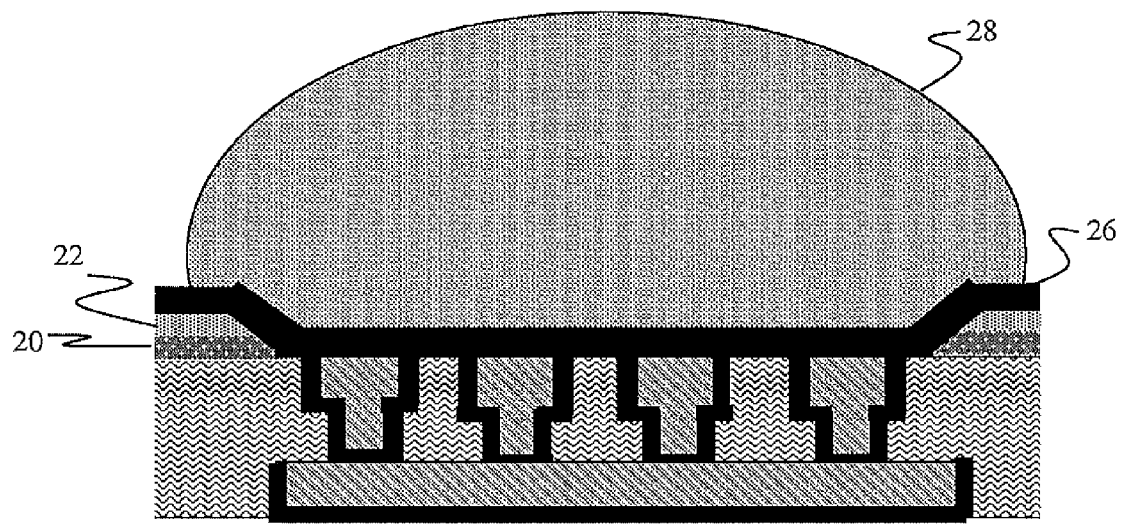

In FIG. 7, a solder bump is deposited on the capture pad area. More specifically, a lead-free solder bump 28 such as, for example, tin/copper, tin/silver and tin/gold in combination with SAC alloys, is deposited on the capture pad 26.

Figure 8:
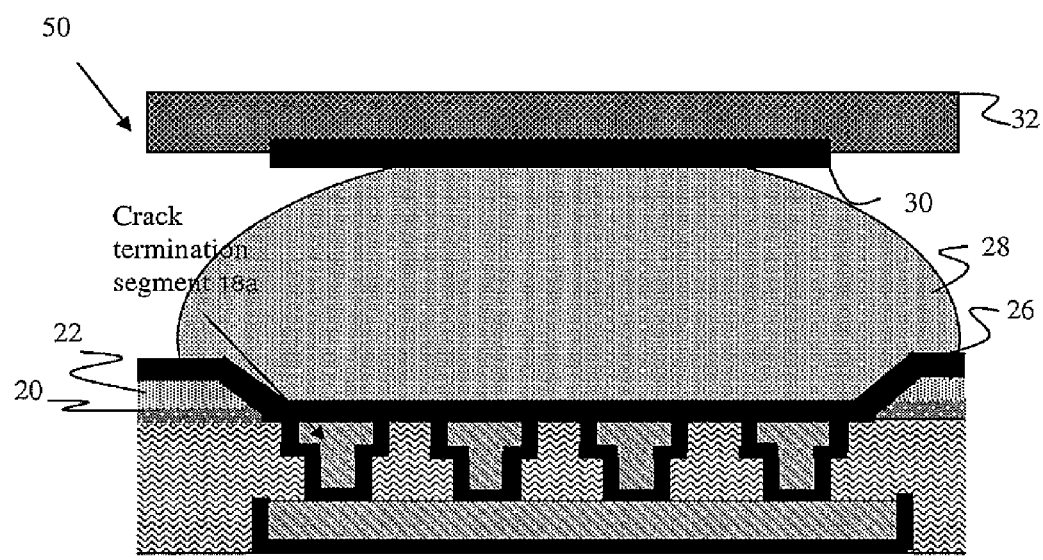

FIG. 8 shows a packaged chip generally designated as reference numeral 50. The packaged chip 50 shows the solder bump 28 connected to a bonding pad 30 of a laminate 32. The laminate 32 can be an organic or ceramic laminate. FIG. 8 also graphically shows fatigue crack termination in BLM segment (capture pad 30).

As should be understood by those of skill in the art, the present invention provides a metal wiring island pattern designed to prevent delamination of an entire wiring layer. With the island pattern, a crack or delamination of a single copper island 18a will not result in device failure. That is, an island 18a at a periphery of the C4/BLM structure will cause an interruption of the stresses which, in turn, acts as a termination point for the propagation of the crack. In this way, any initiated crack or delamination will stop at a single wiring section and hence not propagate along the entire interface between the intermetallic (IMC) compound in the BLM and the solder material. This structure is applicable to any two parts being joined with a C4 solder bump, particularly for lead free C4s, and including any chip stacking or "3D" application.

Those of skill in the art should now understand that the present invention adds an additional segmentation pattern designed to prevent delamination of an entire wiring layer. With the additional segmentation pattern, stresses will be interrupted at a periphery of the wiring layer which, in turn, acts as a termination point for the propagation of any crack. That is, the outer peripheral segment of the TaN/TiW layer 36a (in addition to the segment 18a) will cause an interruption of the stresses which, in turn, acts as termination points for the propagation of the crack. In this way, the C4 fatigue crack will stop at a single interconnect and hence not propagate along the entire interface between the intermetallic (IMC) compound in the BLM and the solder material. This structure is applicable to any two parts being joined with a C4 solder bump, particularly for lead free C4s, and including any chip stacking or "3D" application.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A solder bump structure, comprising:
    a first dielectric layer having a plurality of discrete metal line islands composed of a conductive material in contact with underlying metal layer in the first dielectric layer, wherein each discrete metal line island has a stepped profile comprised of two different cross sectional shapes or sizes;
    a second dielectric layer on the first dielectric layer, the second dielectric layer having a via exposing upper surfaces of the plurality of discrete metal line islands;
    a capture pad formed in the via and in direct contact with the exposed upper surfaces of the plurality of discrete metal line islands and with portions of the second dielectric layer, wherein the capture pad is comprised of metal different than that of the plurality of discrete metal line islands; and
    a solder bump in electrical connection with the metal layer through the capture pad and the plurality of discrete metal line islands.

2. The structure of claim 1, further comprising a laminate bonded to the solder bump.

3. The structure of claim 1, wherein the solder bump is a lead free solder bump.

4. The structure of claim 1, wherein the conductive material is copper.

5. The structure of claim 4, wherein the copper is lined with a barrier layer.

6. The structure of claim 1, wherein the plurality of discrete metal line islands are of various sizes and shapes.

7. The structure of claim 2, wherein:
    the capture pad is an under bump metallurgy or ball limiting metallurgy between the solder bump and the discrete metal line islands;
    the under bump metallurgy or ball limiting metallurgy includes a refractory metal base layer, a conductive metal interlayer and a diffusion barrier top-layer.

8. The structure of claim 1, wherein the via is formed above the respective two different cross-section shapes or sizes comprising the discrete metal islands.

9. The structure of claim 1, wherein the capture pad includes a nickel material sandwiched between an upper gold layer and a bottom barrier layer.

10. The structure of claim 1, wherein the capture pad is an under bump metallurgy or a ball limiting metallurgy.

11. A structure, comprising:
    a plurality of discrete metal islands formed in a dielectric layer and in contact with an underlying metal, the plurality of discrete metal islands comprising a metal liner and a metal material over the metal liner;
    one or more dielectric layers with a via exposing a surface of the discrete metal islands;
    a capture pad and a conductive pad formed in the via and in direct contact with the exposed surface of the plurality of discrete metal islands and portions of the one or more dielectric layers, wherein the capture pad and conductive pad are comprised of metal different than that of the discrete metal islands;
    a lead free solder bump directly on the capture pad and the conductive pad, and in electrical connection to the plurality of discrete metal line islands; and
    a laminate structure bonded to the lead free solder bump.

12. The structure of claim 11, wherein the discrete metal islands include various sizes and shapes.

13. The structure of claim 11, wherein the capture pad and the conductive pad metal are over the entire surface of the one or more dielectric layers.

14. The structure of claim 11, wherein:
    the metal liner of the plurality of discrete metal islands includes a tantalum nitride material and the metal material over the metal liner is copper, and the plurality of discrete metal islands range from 1 micron to 10 microns across and of several different shapes and sizes including radial or arc-shaped offset segments surrounding several sized openings.

15. The structure of claim 8, wherein:

the capture pad is formed on upper surfaces of the first dielectric layer, upper surfaces and sloped surfaces of the second dielectric layer, metal liners of the discrete metal line islands, and the upper surfaces of the discrete metal line islands; and each stepped profile of the discrete metal line islands comprises defines an upper portion that is wider than a lower portion, wherein the dielectric layer is between each upper portion of adjacent ones of the discrete metal islands.

16. The structure of claim 8, wherein the solder bump is formed in the via opened in the second dielectric layer.

17. The structure of claim 1, wherein the discrete metal line islands comprise radial or arc-shaped offset segments surrounding several sized openings.

18. A solder bump structure, comprising:

a dielectric layer having a plurality of discrete metal line islands composed of a conductive material in contact with underlying metal layer in the dielectric layer, wherein each discrete metal line island comprises two different cross sectional shapes or sizes;

one or more upper dielectric layers having a via opened to the discrete metal line islands, and intermediate metal layers in the via and in direct contact with the plurality of discrete metal line islands; and a solder bump in electrical connection with the metal layer through the plurality of discrete metal line islands, wherein the discrete metal line islands comprise a pattern of one or more openings or shapes selected from the group consisting of a grid pattern, checkerboard pattern, segmented lines, overlapping lines, offset lines, perpendicular lines, arc segments and combinations thereof.

19. The structure of claim 11, wherein:

the via exposes an upper surface of each of the discrete metal line islands; and the capture pad and conductive pad are comprised of a nickel material sandwiched between an upper gold layer and a bottom barrier layer.

20. The structure of claim 19, wherein the barrier layer comprises TiW.

21. The structure of claim 11, wherein:

two or more of the discrete metal line islands comprise a different pattern of one or more openings or shapes selected from the group consisting of a grid pattern, checkerboard pattern, segmented lines, overlapping lines, offset lines, perpendicular lines, arc segments and combinations thereof;

walls of the via are tapered toward the plurality of discrete metal line islands; and an intermediate metal layer is over an upper surfaces and tapered surfaces of an upper dielectric layer.

\* \* \* \* \*